(12) United States Patent
Lienau

(10) Patent No.: US 6,266,267 B1
(45) Date of Patent: Jul. 24, 2001

(54) SINGLE CONDUCTOR INDUCTIVE SENSOR FOR A NON-VOLATILE RANDOM ACCESS FERROMAGNETIC MEMORY

(75) Inventor: Richard M. Lienau, Santa Fe, NM (US)

(73) Assignee: Pageant Technologies, Inc., Toronto (CA)

( * ) Notice: Subject to any disclaimer, the term of this patent is extended or adjusted under 35 U.S.C. 154(b) by 0 days.

(21) Appl. No.: 09/515,964

(22) Filed: Feb. 29, 2000

Related U.S. Application Data

(60) Provisional application No. 60/121,925, filed on Mar. 4, 1999.

(51) Int. Cl.⁷ .................................................. G11C 17/02
(52) U.S. Cl. .......................................... 365/145; 365/158
(58) Field of Search .................................... 365/145, 158, 365/171; 257/295

(56) References Cited

U.S. PATENT DOCUMENTS

| | | | |
|---|---|---|---|
| 3,048,829 | 8/1962 | Bradley | 365/171 |
| 3,223,985 | 12/1965 | Bittmann et al. | 365/61 |
| 3,418,645 | 12/1968 | Fussell | 365/61 |
| 3,466,634 | 9/1969 | Gamblin | 365/197 |
| 3,613,013 | 10/1971 | Vallese | 325/322 |
| 3,714,523 | 1/1973 | Bate | 257/252 |
| 3,727,199 | 4/1973 | Lekven | 365/172 |
| 3,846,769 * | 11/1974 | Shepherd | 365/239 |
| 4,283,643 | 8/1981 | Levin | 327/511 |
| 4,360,899 | 11/1982 | Dimyan et al. | 365/171 |
| 4,607,271 | 8/1986 | Popovic et al. | 257/422 |
| 4,791,604 | 12/1988 | Lienau | 365/9 |
| 4,803,658 | 2/1989 | Grimes | 365/87 |
| 4,831,427 | 5/1989 | Coleman | 365/171 |
| 4,887,236 | 12/1989 | Schloemann | 365/173 |
| 5,075,247 | 12/1991 | Matthews | 437/52 |
| 5,089,991 | 2/1992 | Matthews | 365/9 |
| 5,107,460 | 4/1992 | Matthews | 365/122 |
| 5,208,477 | 5/1993 | Kub | 257/421 |
| 5,289,410 | 2/1994 | Katti et al. | 365/170 |
| 5,295,097 | 3/1994 | Lienau | 365/170 |
| 5,329,480 | 7/1994 | Wu et al. | 365/170 |
| 5,329,486 * | 7/1994 | Lage | 365/145 |
| 5,375,082 * | 12/1994 | Katti et al. | 365/171 |
| 5,768,181 * | 6/1998 | Zhu et al. | 365/173 |
| 5,864,498 * | 1/1999 | Womack | 365/173 |
| 5,926,414 | 7/1999 | McDowell | 365/170 |
| 6,005,800 * | 12/1999 | Koch et al. | 365/173 |
| 6,034,887 * | 3/2000 | Gupta et al. | 365/173 |

\* cited by examiner

Primary Examiner—Tan T. Nguyen
(74) Attorney, Agent, or Firm—Jones, Waldo, Holbrook & McDonough; Michael W. Starkweather

(57) ABSTRACT

A nonvolatile ferromagnetic RAM device and method that is capable of reading the data stored in each magnet quickly and efficiently utilizing a minimal number of components. Specifically, there is a nonvolatile ferromagnetic RAM which is capable of reading the data stored in each magnetic bit. Specifically, there is a ferromagnetic memory cell, comprising a bit (3), made of a ferromagnetic material, having a remnant polarity. A write line (2), located proximate the bit, is coupled to receive: 1) a first current sufficient to create the remnant polarity, and 2) a pulsed second current, insufficient to create any remnant polarity, but sufficient to potentially fluctuate the remnant polarity during the second current pulse. A sense line (1), positioned proximate the bit (3), has the purpose of detecting any potentially created remnant polarity fluctuation.

51 Claims, 3 Drawing Sheets

SINGLE CONDUCTOR INDUCTIVE SENSOR FOR A NON-VOLATILE RANDOM ACCESS FERROMAGNETIC MEMORY

PRIORITY OF THE INVENTION

This application claims priority to U.S. Provisional Application No. 60/121,925, filed Mar. 4, 1999.

RELATED PATENT APPLICATIONS

The following provisional patent applications are related to the present invention:

Ser. No. 60/122,731
Ser. No. 60/122,733
Ser. No. 60/121,901
Ser. No. 60/122,822

THE FIELD OF THE INVENTION

The present invention relates to non-volatile random access memory. More particularly, the present invention relates to a single conductor inductive sensor for a non-volatile random access ferromagnetic memory device.

BACKGROUND OF THE INVENTION

Computer memory technology has experienced profound advances in the last two decades. One of the first computer memories involved magnetic core memory technology. To form each magnetic core, a miniature toroidal-shaped ferrite core was interwoven into a fine matrix of wires. By applying a current through the wires, the core would be programmed with either a north or south directed flux path that would correspond to a logic one or zero. The advantage of magnetic core memory is that it is non-volatile, or does not need to be refreshed to remember the stored logic signal. Additionally, Core memory is also "radiation-hard" or unaffected by ionizing radiation like gamma rays. However, the assembly of the magnetic core array was very labor intensive and was quickly abandoned when semiconductor processes were developed.

Currently one of the most popular memory technologies uses either a form of MOS (metal-oxide-semiconductor) or CMOS (complementary metal-oxide-semiconductor) processes. However, it is well known that this technology requires constant refreshing of each memory cell to maintain the logic signal strength due to the inherent leakage of capacitors. This constant refreshing of the memory cells is not a problem when there is an unlimited voltage source, but in many applications, like laptop computers and cell phones, there is a finite supply. To deal with this problem, rechargeable batteries have been used in all portable electrical devices.

The problem with using devices that have capacitive memory arrays is the inconvenience in keeping the batteries properly charged every few hours. Therefore, there is a need for a nonvolatile memory device that does not need to be refreshed and is inexpensive and quick to make.

Examples of patents related to non-volatile RAM, each of which are herein incorporated by reference for their supporting teachings, are as follows:

U.S. Pat. No. 4,360,899 to Dimyan et al. teaches a non-volatile random access memory having a plurality of magnetic cells arranged in an array on a major surface of a substrate. In operation, a single magnetic cell is selected and inductively switched between opposite remanent, (i.e. permanent) states, upon the simultaneous application of electrical pulses to a pair of conductors intersecting adjacent the selected cell. Each electrical pulse has an amplitude which is insufficient to inductively switch the remanent state of the selected cell. However, the combined amplitude of the electrical pulses is at least equal to the amplitude required for such a switch.

U.S. Pat. No. 5,068,826 to Mathews teaches a non-volatile, static magnetic memory device, whose operation is based on the Hall effect. The device includes a magnetic patch which stores data in the form of a magnetic field, a semiconductor Hall bar, and a pair of integrally-formed bipolar transistors which are used for amplifying and buffering the Hall voltage produced along the Hall bar. In use, current is forced to flow down the length of the Hall bar causing a Hall voltage to be developed in a direction transverse to the direction of both the magnetic field and the current. The bases of the bipolar transistors are ohmically coupled to the Hall bar to sense the Hall voltage—the polarity of which is representative of the stored information. Finally, a system of current carrying conductors is employed for writing data to individual magnetic patches.

U.S. Pat. No. 5,295,097 to Lineau teaches a nonvolatile random access memory having a substrate that carries separate magnetically polarizable domains. Each domain is surrounded by a full write loop member, and arranged to penetrate a Hall channel of a dual drain FET with its residual magnetic field. The domains are organized in word rows and bit columns, are each written to by a single full write current through the surrounding loop member, and each read by a comparator connected to the FET drains. The memory is capable of being fabricated in a variety of different forms.

U.S. Pat. No. 4,791,604 to Lineau et al. teaches a sheet random access memory (SHRAM). The SHRAM is a non-volatile and transportable memory characterized by its cell density and relatively small size and power requirements, but having the nonvolatile character and rugged of core memory, or magnetic disks or tape. The SHRAM is further characterized by a memory comprising a two dimensional magnetic substrate and a fixed driving device for writing and reading into the substrate. Further, a fixed sensing device for sensing the information is attached at each cell location. The memory media includes not only a homogeneous two dimensional substrate, but also ferrite cores formed into the substrate by photolithographic techniques, wherein the information is stored within the core and read by the sensing device from a gap defined by the core. Memory cells according to the invention can thus be arranged and organized to form destructive readout RAMs, or nondestructive readout Rams in both serial and parallel form.

U.S. Pat. No. 5,926,414 to McDowell et al. teaches a magnetic integrated circuit structure in combination with a carrier-deflection-type magnetic field sensor. Each of a variety of magnet structures realize a condition in which the magnetic field is substantially orthogonal to the direction of travel of carriers of a sense current, thereby achieving maximum sensitivity. By basing a magnetic memory cell on a single minium size MOS device, a small cell may be realized that compares favorably with a conventional DRAM of FLASH memory cell. The greater degree of control over the magnetic field afforded by the magnetic structures enables the cross-coupling between cells in a memory array to be minimized.

U.S. Pat. No. 3,727,199 to Lekven teaches a magnet memeory element and a process for producing such elements in plurality to constitute a static magnetic memory or digital information storage system. Individual binary storage members are afforded directionally preferential magnetic characteristics by flux circuits to establish the preferred axids of Conductors for driving the individual binary storage members (for storing and sensing) are provided in an organized pattern to accomplish selectivity. A batch production process is also disclosed.

OBJECTS AND SUMMARY OF THE INVENTION

It is therefore a feature of the present invention to provide a nonvolatile ferromagnetic RAM device that is capable of reading the data stored in each magnet quickly and efficiently utilizing a minimal number of components. Specifically, there is a nonvolatile ferromagnetic RAM which is capable of reading the data stored in each magnetic bit.

Additionally, a feature of the invention is to provide a ferromagnetic memory cell, comprising a bit (3), made of a ferromagnetic material, having a remnant polarity. There is also a write line (2), located proximate the bit, coupled to receive: 1) a first current sufficient to create the remnant polarity, and 2) a pulsed second current, insufficient to create any remnant polarity, but sufficient to potentially fluctuate the remnant polarity during the second current pulse. Also, there is a sense line (1), positioned proximate the bit (3), to detect the remnant polarity fluctuation.

Yet, a further feature of the invention is to provide an amplifier and detector unit (11), coupled to the sense line (1) for amplifying and detecting any pulse (30) induced into the sense line (1) by fluctuation in the polarity of bit (3) caused by the directed current in the write line (2).

Still, an additional feature is to provide a base (16), oriented in a horizontal plane, wherein the bit has a height that is oriented perpendicular to the horizontal plane of the base. there is a feature to provide the polarity of the bit (3) with a remnant polarity that flows in an opposite direction to that dictated by the directed current in the write line (2), and where the amount of current in the write line (2) is sufficient to cause fluctuations in the polarity of the bit (3), but insufficient to cause a permanent remnant polarity switch.

In yet another feature of the invention, there is a method of storing and retrieving binary data, comprising the steps of: a) providing a memory bit (3), made of ferromagnetic material, having a polarity capable of being directed; b) directing the polarity of the bit (3) to a desired state of remnance by sending a directed current along a write line (2) that is located proximate to the bit (3); and c) detecting the polarity of the bit (3) by sending a current along a sense line (1), and determining whether or not fluctuations are occurring in the polarity of the bit (3).

Another feature of the method has the fluctuations of the remnant polarity of the bit (3) created when the remnant state of the bit (3) is opposite to the state dictated by the direction of a current introduced into the write line (2) in an amount sufficient to cause such fluctuations, but insufficient to permanently switch the remnant polarity of the bit (3).

An additional part of the method has no fluctuations in the polarity of the bit (3) created when the remnant state of the bit (3) is the same as the state dictated by the direction of a current introduced into the write line (2) in an amount sufficient to cause fluctuations in the polarity of the bit (3) if the remnance thereof were in a direction opposite to that dictated by the direction of the current in the write line (2), but insufficient to permanently switch the polarity of the bit (3).

There has thus been outlined, rather broadly, the more important features of the invention so that the detailed description thereof that follows may be better understood, and so that the present contribution to the art may be better appreciated. Those skilled in the art will appreciate that the conception, upon which this disclosure is based, may readily be utilized as a basis for the designing of other structures, methods and systems for carrying out the several purposes of the present invention. It is important, therefore, that the claims are regarded as including such equivalent constructions insofar as they do not depart from the spirit and scope of the present invention.

It is noted that the drawings of the invention are not so scale. The drawings are merely schematic representations, not intended to portray specific parameters of the invention. The drawings are intended to depict only selected embodiments of the invention, and therefore should not be considered a limiting the scope of the invention. The invention will be described with additional specificity and detail through the use of the accompanying drawings. Like numbering between figures represent like elements.

DETAILED DESCRIPTION OF THE PREFERRED EMBODIMENT

Figure 1:
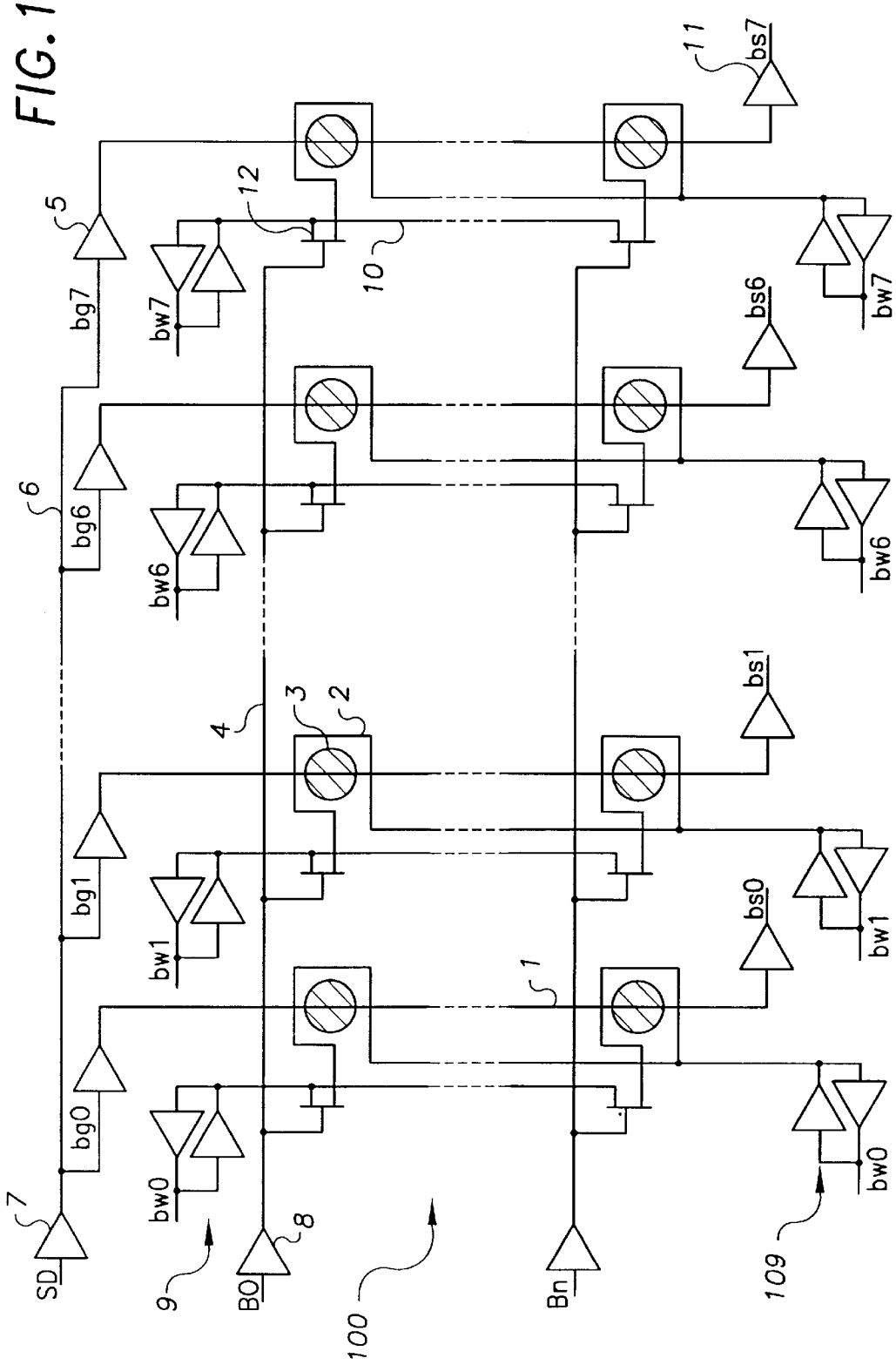
FIG. 1 is a schematic diagram of the nonvolatile random access ferromagnetic memory of the present invention.

The applicant has discovered that the reading of binary data stored within a ferromagnetic bit may be accomplished easily and efficiently using a single conductor inductive sensor in intimate communication therewith. Such a device requires no moving parts or refreshing of stored logic signals, and is capable of sensing magnetically stored data at the micron and submicron levels. Referring now to FIG. 1, there is shown an electrical schematic diagram of the inventive nonvolatile random access ferromagnetic memory circuitry 100. In particular, there are ferromagnetic bits 3, each surrounded by a "set" or "write" coil 2, (also referred to as line 2). Isolation gates 12 are electrically coupled to bit drive lines 10, which are coupled to bit write driver circuits or drivers 9 and 109. Master sense driver 7 is electrically coupled to master sense drive line 6, which is electrically coupled to bit read isolation gates 5. Bit read isolation gates 5 are coupled to conductor sense, or read lines 1, which are coupled to bit sense amplifiers and detectors 11. Byte drivers 8 are coupled to byte drive lines 4, which are coupled to write coils 2. Cross selection between byte drive lines 4, and bit drive lines 10, are prevented by gates 12.

Figure 2:
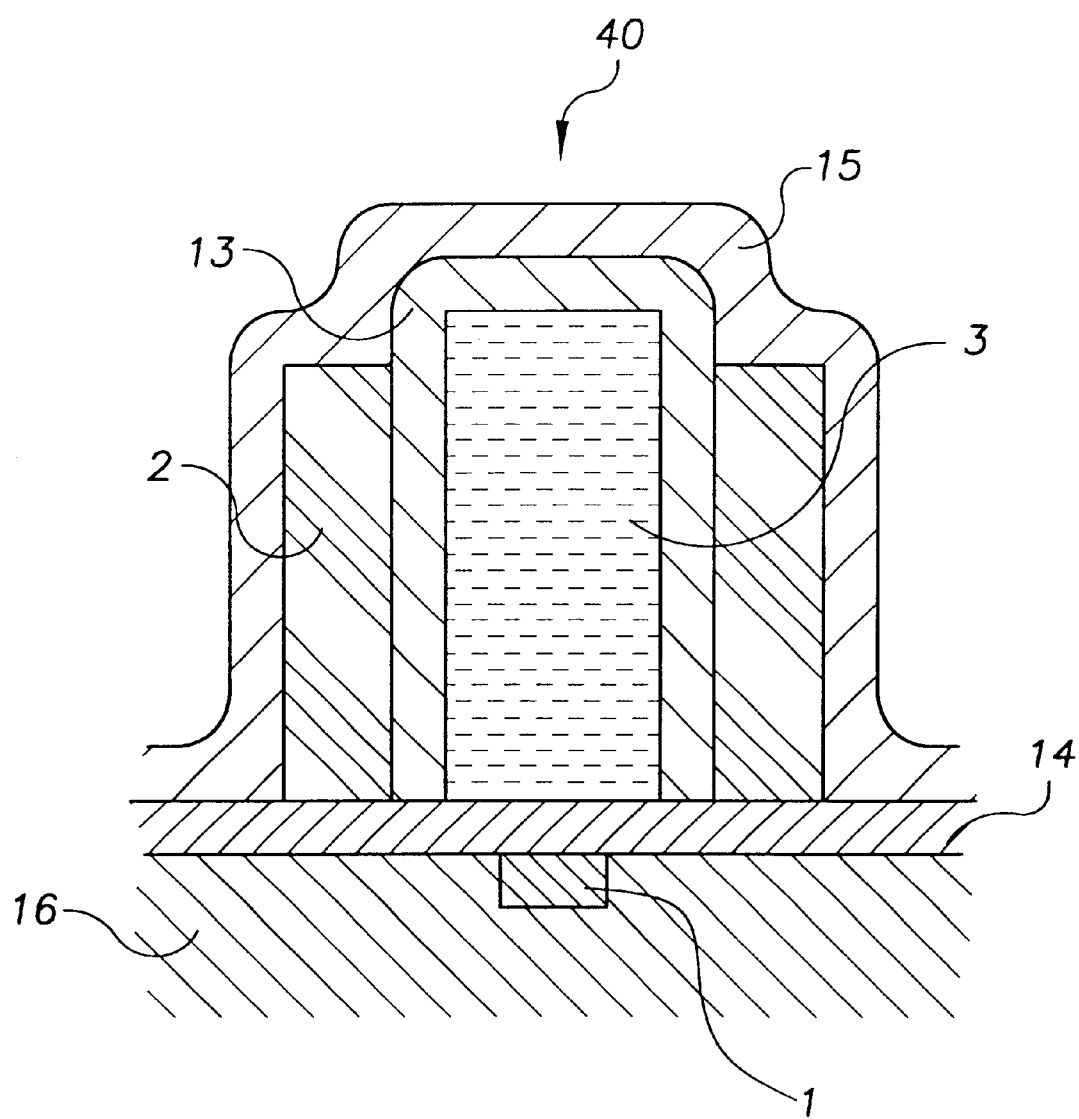
FIG. 2 is a side sectional view of the memory cell elements presented in FIG. 1.

Referring to FIG. 2, there is illustrated a side cross sectional view of the micron, or submicron memory cell elements of FIG. 1. In particular, memory cell 40 has substrate 16 with sense line 1, imbedded therein. In this embodiment, sense line 1, is illustrated as being placed at below the magnet, however, it could be placed at the top of the magnet and still achieve the same results. Sense line 1, may be made of any suitable conductive material known to those skilled in the art, such as Al, Cu, Ag etc. Insulation layer 14 is placed over sense line 1, and may be of any suitable insulative material known to those skilled in the art such as $SiO_2$, $Si_3N_4$, etc. A ferromagnetic memory bit 3 is surrounded by a layer of insulation 13. In a preferred embodiment, ferromagnetic memory bit 3 can be made of any type of ferromagnetic material and have any height to width aspect ratio of greater than 1:1 to cause the magnetic poles to be on the top and bottom of the bit. Write coil 2, surrounds a substantial portion insulation layer 13, which separates write line 2 from memory bit 3. Write coil 2 may be of the same conductive materials as sense line 1. Insulation layer 13 may be of the same insulative materials as insulation layer 14. A final insulation layer 15 or glass layer is placed over all exposed surfaces of memory cell 40. The entire memory cell 40 is disposed upon substrate 16, which can be made of any suitable substrate material known to those skilled in the art such as silicon, glass, and GaAs. Further, substrate 16 and memory cell 40 may be fabricated by any method known to those skilled in the relevant art, such as electroplating, sputtering, E-beam deposition, chemical vapor deposition, and molecular beam epitaxy.

Figure 3:
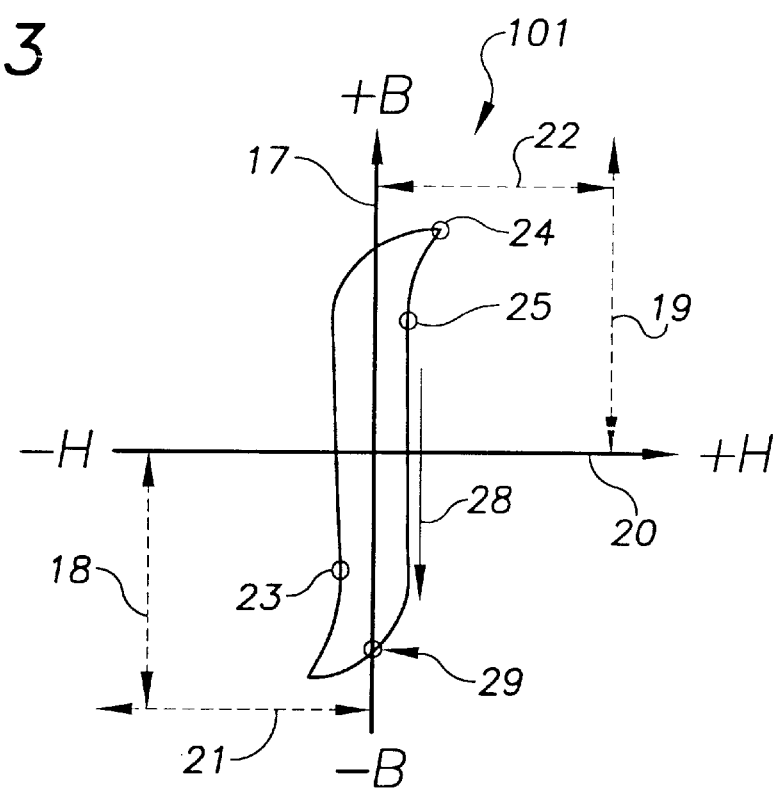
FIG. 3 is a diagram of a typical magnetic hysteresis curve illustrating operation of the invention of FIG. 1.

Referring now to FIG. 3, there is illustrated a typical hysteresis curve 101, which represents the curve for any given ferromagnetic bit in the matrix, and is offered to explain the principle in performing a read operation of the bit. The vertical "B" line 17 represents the coercive force exerted by the current in write coil 2. The minus, or negative indication 18, represents one current direction and its resultant coercive field, while the plus, or positive indication 19 represents the opposite current direction and its resultant field. The horizontal "H" line 20, represents the remnant magnetic field coerced into ferromagnetic bit 3, by the current running through write coil 2. The minus or negative direction 21, represents one magnetic while the plus or positive direction 22 represents the opposite or positive polarity of the bit.

For the purposes of the present illustration, the positive direction of both the "B" line 17, and the "H" line 20, is assumed to set the value of a digital "1" into a selected ferromagnetic bit. When a ferromagnetic bit, has a digital "0" its polarity will reside at a quiescent state of remnant in the negative "H" and negative "B" quadrant of hysteresis curve 101, such as at point 23. In order to change the value of the ferromagnetic bit 3, to a digital "1," a current is applied through write coil 2, in a direction indicating a positive "H" value, and in an amount sufficient to provide a positive "B" value, or a sufficient coercive force that is capable of reaching a saturation point 24, on the positive side of "H" line 20. Once excited to this state, the magnetic flux will then settle down to a quiescent state of new remnance, represented at point 25. Thus, the digital value of the ferromagnetic bit is changed from a "0" to a "1". Of course, a skilled artisan will realize that this process can be reversed to change the logic 1 to a logic 0 by simply reversing a sufficient current through line 2.

Figure 4:
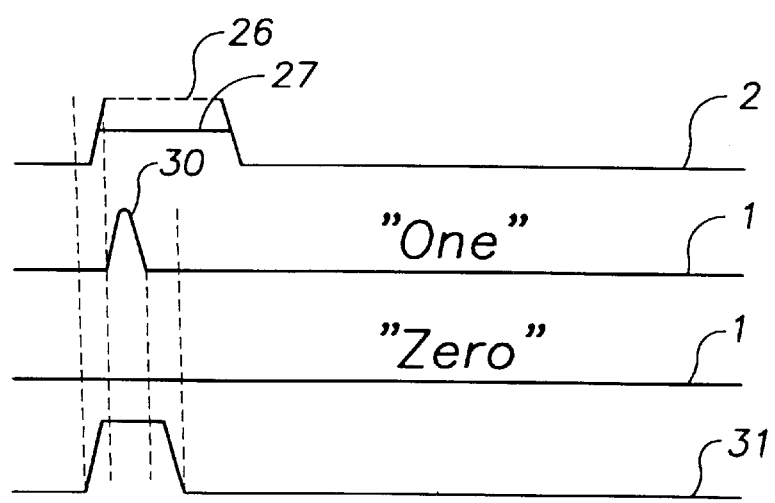
FIG. 4 is a timing diagram of the memory cell elements of FIG. 1 for reading a single positive bit of data stored in a memory cell.

Referring now to FIG. 4, there is illustrated a timing diagram of the memory cell elements of FIG. 1 for reading a single positive or logic "1" bit of data stored in an individual memory cell. Such a positive bit would represent a digital "1" with its positive "H" magnetic field represented as point 25 on the hysteresis curve. To write a digital "1" value into a magnetic bit, a sufficiently strong positive current is applied to a given write coil 2, as demonstrated by pulse 26. Thus, setting a logic "1" reading into the bit.

During the reading of the magnetic bit, a fraction of the previous write current 27 is generated on the same write line 2, and in this case in an opposite direction. This is why the current 27 is less than what is needed for full saturation, so that there will be no permanent effect to the bit's polarity that is currently residing there. It is noted that, for the purpose of this discussion, the direction of the current pulse will be in an opposite direction as that needed to create the logic "1" storage. Additionally, in reference to the hysteresis curve, the effect of this current pulse is represented by downwardly pointing arrow 28, which represents the movement of point 25 toward point 29. Specifically, under this condition, the polarity of the bit's magnetic field moves rapidly along the curve toward point 29, which is coincidentally, but not necessarily, at the neutral polarity point along the "H" line, or on the vertical "B" line 17. The main point is that the flux strength has shifted dramatically in a short time as a result of the current pulse and that the magnetic bit has not been saturated to cause a permanent change in the polarity of the bit. Thereby, the removal of the current pulse, which has a lesser coercive force than the write current, allows the polarity of the magnetic bit to slide back to the previously quiescent remnance point 25.

Now that write line 2 has created a noticeable but temporary effect in the bit, it is necessary to sense that effect using sense line 1. Specifically, as the magnetic field of the bit moves from point 25 to point 29, the shift in the field induces a pulse 30 on sense line 1. Timing line 31 represents the read, or sense strobe, which brackets the induced current pulse 30. The gated result (not shown) is detected by amplifier 11, shown in FIG. 1.

If a selected bit were set with a digital "0" which would be induced by a full negative current through write coil 2, then the proportionally smaller negative current induced through write coil 2, during read time, will have no effect on the remnant field set into the magnetic bit, and thus will not induce a pulse on sense line 1, indicating a logical "zero", as shown in FIG. 4.

It would be obvious to one skilled in the art of semiconductors and magnetics that the reading operation of directing current along line 2 could be switched. Thus, the logical zero could read a pulse 30 and a logical one would have no pulse on line 1.

Method of Operation

In operation, a digital "1" or "0" is first assigned to each ferromagnetic remnant state (i.e. a North directed remnant could be assigned a "1" and the South directed remnant could be assigned a "0," or vice versa). The desired digital value is then programmed into each ferromagnetic bit 3, by inducing a current through write line 2, in a direction which dictates magnetic polarity toward the desired remnance, and in an amount sufficient to permanently affect such a remnance. Such a process is typically known in the industry as "write time." Reading of the information stored in each ferromagnetic bit 3 is known as "read time" and takes place as a two-step process. First, a current is induced through write line 2 in a predetermined set direction and in an amount sufficient to cause fluctuations in the magnetic polarity of bit 3, when the remnance thereof is in a direction opposite to that dictated by the direction of the current in write line 2. The direction of the current must be determined beforehand, and must not be sufficient to cause a permanent switch in the magnetic remnance. In other words, the amount of the current will be sufficient to start a shift in magnetic remnance toward the opposite remnant, but will be insufficient to complete such a switch. The fluctuations in the magnetic field induce a pulse, or wave, into the sense line 1, which is amplified and detected by amplifying and detecting unit 11.

When the remnance in ferromagnetic bit 3 is in the same direction as that dictate by the direction of the current induced into the write line 2, no magnetic field fluctuations will be produced because there will be no shift toward an opposite remnant created by the current. Therefore, no pulse, or wave, will be induced into sense line 1, and the absence of a pulse will then be read by amplifying and detecting unit 11. The presence or absence of a pulse, or wave then ultimately depends on whether a "1" or a "0" was stored in ferromagnetic bit 3.

As used herein, the term "fluctuation" or "fluctuations" when applied to the magnetic remnance or polarity of the ferromagnetic bits 3, means a shift in direction of the polarity from one remnant to an opposite remnant which is not complete, or does not result in a permanent switch in remnance.

Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, function, manner of operation, assembly, and use may be made without departing from the principles and concepts set forth herein.

What is claimed is:

1. A ferromagnetic memory cell, comprising:
   a) a bit, made of a ferromagnetic material, having a remnant polarity, and having a height to width aspect ratio of greater than 1:1;
   b) a write line, located proximate the bit, coupled to receive:
      1) a first current sufficient to create the remnant polarity, and
      2) a pulsed second current, insufficient to create any remnant polarity, but sufficient to potentially fluctuate the remnant polarity during the second current pulse;
   c) a sense line, positioned proximate the bit, to detect the remnant polarity fluctuation and
   d) a base, oriented in a horizontal plane, wherein the bit has a height that is oriented perpendicular to the horizontal plane of the base.

2. The memory cell of claim 1, further comprising: an amplifier and detector unit, coupled to the sense line for amplifying and detecting any pulse induced into the sense line by fluctuation in the polarity of bit caused by the directed current in the write line.

3. The memory cell of claim 1, wherein the polarity of the bit has a remnant polarity that flows in an opposite direction to that dictated by the second current in the write line, and where the amount of the second current in the write line is sufficient to cause fluctuations in the polarity of the bit, but insufficient to cause a permanent remnant polarity switch.

4. The memory cell of claim 1, wherein the remnant polarity of the bit has a remnant polarity that flows in a same direction to that dictated by the second current in the write line, where the amount of the second current in the write line will not cause fluctuations in the polarity of the bit.

5. The memory cell of claim 1, wherein the remnant polarity of the bit has a remnant polarity in the same direction to that dictated by the second current in the write line, whereby the amount of the second current in the write line will not cause fluctuations in the polarity of the bit.

6. The memory cell of claim 1, wherein the presence of a pulse in sense line indicates a digital value of "1," and the absence of a pulse in sense line indicates a digital value of "0."

7. The memory cell of claim 1, wherein the write line proximately circumscribes a periphery of the bit.

8. The memory cell of claim 1, wherein the sense line is disposed in a substrate and located below the bit.

9. The memory cell of claim 8, wherein the sense line is positioned to extend along a central portion of the bit.

10. The memory cell of claim 1, wherein the sense line is located above the bit.

11. A method of storing and retrieving binary data, comprising the steps of:
    a) providing a memory bit, made of ferromagnetic material, having a polarity capable of being directed;
    b) directing the polarity of the bit to a desired state of remnance by sending a directed current along a write line that is located proximate to the bit;
    c) detecting the polarity of the bit by inducing a current along a sense line, and determining whether or not fluctuations are occurring in the polarity of the bit; and
    d) wherein the fluctuations of the remnant polarity of the bit are created when the remnant state of the bit is opposite to the state dictated by the direction of a current introduced into the write line in an amount sufficient to cause such fluctuations, but insufficient to permanently switch the remnant polarity of the bit.

12. The method of claim 11, wherein the height to width aspect ratio of the bit is greater than 1:1.

13. The method of claim 11, wherein the presence of fluctuations in the polarity of the bit induce a wave into the current flowing through the sense line, which is detected by an amplifier and detector unit coupled to the sense line.

14. The method of claim 13, wherein the presence of a wave indicates a digital value of "1," and the absence of a wave in sense line indicates a digital value of "0."

15. The method of claim 11, wherein the write line circumscribes proximate a periphery of the bit.

16. The method of claim 11, wherein the sense line is disposed in a substrate and located below the bit.

17. The method of claim 15, wherein the sense line is positioned to extend approximate a central portion of the bit.

18. The method of claim 11, wherein the sense line is located above the bit.

19. A ferromagnetic memory cell, comprising:
    a) a bit, made of a ferromagnetic material, having a remnant polarity;
    b) a write line, located proximate the bit, coupled to receive:
       1) a first current sufficient to create the remnant polarity, and
       2) a pulsed second current, insufficient to create any remnant polarity, but sufficient to potentially fluctuate the remnant polarity during the second current pulse; and
    c) a sense line, positioned proximate the bit, to detect the remnant polarity fluctuation, wherein the sense line is disposed in a substrate and located below the bit.

20. The memory cell of claim 19, wherein the sense line is positioned to extend along a central portion of the bit.

21. A ferromagnetic memory cell, comprising:
    a) a bit, made of a ferromagnetic material, having a remnant polarity;
    b) a write line, located proximate the bit, coupled to receive:
       1) a first current sufficient to create the remnant polarity, and
       2) a pulsed second current, insufficient to create any remnant polarity, but sufficient to potentially fluctuate the remnant polarity during the second current pulse; and c) a sense line, positioned proximate the bit, to detect the remnant polarity fluctuation, wherein the sense line is located above the bit.

22. A ferromagnetic memory cell, comprising:
a) a bit, made of a ferromagnetic material, having a remnant polarity;
b) a write line, located proximate the bit, coupled to receive:
 1) a first current sufficient to create the remnant polarity, and
 2) a pulsed second current, insufficient to create any remnant polarity, but sufficient to potentially fluctuate the remnant polarity during the second current pulse;
c) a sense line, positioned proximate the bit, to detect the remnant polarity fluctuation; and
wherein the polarity of the bit has a remnant polarity that flows in an opposite direction to that dictated by the second current in the write line, and where the amount of the second current in the write line is sufficient to cause fluctuations in the polarity of the bit, but insufficient to cause a permanent remnant polarity switch.

23. The memory cell of claim 22, wherein the sense line is disposed in a substrate and located below the bit.

24. The memory cell of claim 23, wherein the sense line is positioned to extend along a central portion of the bit.

25. The memory cell of claim 22, wherein the sense line is located above the bit.

26. A ferromagnetic memory cell, comprising:
a) a bit, made of a ferromagnetic material, having a remnant polarity;
b) a write line, located proximate the bit, coupled to receive:
 1) a first current sufficient to create the remnant polarity, and
 2) a pulsed second current, insufficient to create any remnant polarity, but sufficient to potentially fluctuate the remnant polarity during the second current pulse;
c) a sense line, positioned proximate the bit, to detect the remnant polarity fluctuation; and
wherein the remnant polarity of the bit has a remnant polarity that flows in a same direction to that dictated by the second current in the write line, where the amount of the second current in the write line will not cause fluctuations in the polarity of the bit.

27. The memory cell of claim 26, wherein the sense line is disposed in a substrate and located below the bit.

28. The memory cell of claim 27, wherein the sense line is positioned to extend along a central portion of the bit.

29. The memory cell of claim 26, wherein the sense line is located above the bit.

30. A ferromagnetic memory cell, comprising:
a) a bit, made of a ferromagnetic material, having a remnant polarity;
b) a write line, located proximate the bit, coupled to receive:
 1) a first current sufficient to create the remnant polarity, and
 2) a pulsed second current, insufficient to create any remnant polarity, but sufficient to potentially fluctuate the remnant polarity during the second current pulse;
c) a sense line, positioned proximate the bit, to detect the remnant polarity fluctuation; and
wherein the remnant polarity of the bit has a remnant polarity in the same direction to that dictated by the second current in the write line, whereby the amount of the second current in the write line will not cause fluctuations in the polarity of the bit.

31. The memory cell of claim 30, wherein the sense line is disposed in a substrate and located below the bit.

32. The memory cell of claim 31, wherein the sense line is positioned to extend along a central portion of the bit.

33. The memory cell of claim 30, wherein the sense line is located above the bit.

34. A ferromagnetic memory cell, comprising:
a) a bit, made of a ferromagnetic material, having a remnant polarity;
b) a write line, proximately circumscribing a periphery of the bit, coupled to receive:
 1) a first current sufficient to create the remnant polarity, and
 2) a pulsed second current, insufficient to create any remnant polarity, but sufficient to potentially fluctuate the remnant polarity during the second current pulse; and
c) a sense line, positioned proximate the bit, to detect the remnant polarity fluctuation.

35. The memory cell of claim 34, wherein the sense line is disposed in a substrate and located below the bit.

36. The memory cell of claim 35, wherein the sense line is positioned to extend along a central portion of the bit.

37. The memory cell of claim 34, wherein the sense line is located above the bit.

38. A method of storing and retrieving binary data, comprising the steps of:
a) providing a memory bit, made of ferromagnetic material, having a polarity capable of being directed;
b) directing the polarity of the bit to a desired state of remnance by sending a directed current along a write line that is located proximate to the bit;
c) detecting the polarity of the bit by inducing a current along a sense line, and determining whether or not fluctuations are occurring in the polarity of the bit; and
wherein no fluctuations in the polarity of the bit are created when the remnant state of the bit is the same as the state dictated by the direction of a current introduced into the write line in an amount sufficient to cause fluctuations in the polarity of the bit if the remnance thereof were in a direction opposite to that dictated by the direction of the current in the write line, but insufficient to permanently switch the polarity of the bit.

39. The method of claim 38, wherein the height to width aspect ratio of bit is greater than 1:1.

40. The method of claim 38, wherein the presence of fluctuations in the polarity of the bit induce a wave into the current flowing through the sense line, which is detected by an amplifier and detector unit coupled to the sense line.

41. The method of claim 40, wherein the presence of a wave indicates a digital value of "1," and the absence of a wave in sense line indicates a digital value of "0."

42. The method of claim 38, wherein the write line circumscribes proximate a periphery of the bit.

43. The method of claim 42, wherein the sense line is positioned to extend approximate a central portion of the bit.

44. The method of claim 38, wherein the sense line is disposed in a substrate and located below the bit.

45. The method of claim 38, wherein the sense line is located above the bit.

46. A method of storing and retrieving binary data, comprising the steps of:
- a) providing a memory bit, made of ferromagnetic material formed into a height to width aspect ratio of greater than 1:1, having a polarity capable of being directed;
- b) directing the polarity of the bit to a desired state of remnance by sending a directed current along a write line that circumscribes proximate a periphery of the bit; and
- c) detecting the polarity of the bit by inducing a current along a sense line, and determining whether or not fluctuations are occurring in the polarity of the bit.

47. The method of claim 46, wherein the presence of fluctuations in the polarity of the bit induce a wave into the current flowing through the sense line, which is detected by an amplifier and detector unit coupled to the sense line.

48. The method of claim 47, wherein the presence of a wave indicates a digital value of "1," and the absence of a wave in sense line indicates a digital value of "0."

49. The method of claim 46, wherein the sense line is disposed in a substrate and located below the bit.

50. The method of claim 46, wherein the sense line is positioned to extend approximate a central portion of the bit.

51. The method of claim 46, wherein the sense line is located above the bit.

* * * * *